(12) United States Patent
Nagase (10) Patent No.: US 9,112,470 B2
(45) Date of Patent: Aug. 18, 2015

(54) TRANSMISSION METHOD, TRANSMISSION DEVICE, TRANSMISSION PROGRAM, AND TRANSMISSION SYSTEM

(71) Applicant: Tomohiro Nagase, Kanagawa (JP)

(72) Inventor: Tomohiro Nagase, Kanagawa (JP)

(73) Assignee: NEC PLATFORMS, LTD., Kawasaki (JP)

( * ) Notice: Subject to any disclaimer, the term of this patent is extended or adjusted under 35 U.S.C. 154(b) by 0 days.

(21) Appl. No.: 14/372,252

(22) PCT Filed: Jan. 11, 2013

(86) PCT No.: PCT/JP2013/050402
§ 371 (c)(1),
(2) Date: Jul. 15, 2014

(87) PCT Pub. No.: WO2013/111627
PCT Pub. Date: Aug. 1, 2013

(65) Prior Publication Data
US 2014/0369399 A1   Dec. 18, 2014

(30) Foreign Application Priority Data

Jan. 24, 2012  (JP) ................. 2012-012164

(51) Int. Cl.
*H03G 3/20* (2006.01)
*H04L 25/02* (2006.01)
(Continued)

(52) U.S. Cl.
CPC ............... *H03G 3/20* (2013.01); *H04L 1/1692* (2013.01); *H04L 1/189* (2013.01); *H04L 1/1858* (2013.01); *H04L 5/16* (2013.01); *H04L 25/0264* (2013.01); *H04L 25/03885* (2013.01)

(58) Field of Classification Search
CPC .... H03G 3/20; H04L 25/03885; H04L 1/189; H04L 5/16; H04L 1/1858; H04L 1/1692; H04L 25/0264
See application file for complete search history.

(56) References Cited

U.S. PATENT DOCUMENTS 5,940,403 A *  8/1999  Williams .................. 370/465
6,891,856 B2 *  5/2005  Umayabashi ............. 370/468
(Continued)

FOREIGN PATENT DOCUMENTS

CN   1985486 A     6/2007
JP   60-233996 A  11/1985
(Continued)

OTHER PUBLICATIONS

International Search Report for PCT Application No. PCT/JP2013/050402, mailed on Feb. 12, 2013.
(Continued)

*Primary Examiner* — Hirdepal Singh
(74) *Attorney, Agent, or Firm* — Sughrue Mion, PLLC (57) ABSTRACT

To keep communication even if a distance between transmission devices is farther and a transmission distance therebetween is longer.
A transmission device for alternately performing transmission and reception to/from a communication destination transmission device transmits transmit data to the communication destination transmission device. It receives return data transmitted by the communication destination transmission device after the transmit data reaches the communication destination transmission device. A predetermined period of time is assumed as one time unit, one transmission of transmit data and one reception of return data are tried within the one time unit, and when it is determined that one transmission of transmit data and one reception of return data do not fall within the one time unit, the transmission device is controlled such that N number of transmit data are continuously transmitted and then N number of return data are continuously received within N (N is an integer of two or more) time units.

8 Claims, 7 Drawing Sheets

(51) Int. Cl.
*H04L 1/16* (2006.01)
*H04L 1/18* (2006.01)
*H04L 5/16* (2006.01)
*H04L 25/03* (2006.01)

(56) References Cited

U.S. PATENT DOCUMENTS

| | | | |
|---|---|---|---|
| 7,149,242 B1* | 12/2006 | Chea | 375/219 |
| 7,764,706 B2* | 7/2010 | Tavli et al. | 370/444 |
| 8,589,719 B2* | 11/2013 | Matsui | 713/501 |
| 2002/0048062 A1 | 4/2002 | Sakamoto et al. | 359/124 |
| 2007/0003054 A1* | 1/2007 | Ransijn et al. | 379/413 |
| 2007/0025316 A1* | 2/2007 | Yamasaki et al. | 370/346 |
| 2008/0022179 A1* | 1/2008 | Lee | 714/748 |
| 2008/0292037 A1* | 11/2008 | Fujita et al. | 375/354 |
| 2009/0243930 A1* | 10/2009 | Tien | 342/360 |
| 2010/0316099 A1* | 12/2010 | Sugita et al. | 375/219 |
| 2012/0297100 A1* | 11/2012 | Du | 710/105 |
| 2013/0195442 A1* | 8/2013 | Murakami et al. | 398/25 |
| 2014/0073243 A1* | 3/2014 | Hijioka et al. | 455/41.1 |
| 2014/0193150 A1* | 7/2014 | Mukai et al. | 398/67 |

FOREIGN PATENT DOCUMENTS

| | | |
|---|---|---|
| JP | 1-208928 A | 8/1989 |
| JP | 3-229532 A | 10/1991 |
| JP | 4-51642 A | 2/1992 |
| JP | 11-215107 A | 8/1999 |
| JP | 11-284609 A | 10/1999 |
| JP | 2001-230822 A | 8/2001 |
| JP | 2002-209235 A | 7/2002 |
| JP | 2002-290316 A | 10/2002 |
| JP | 2005-27029 A | 1/2005 |
| JP | 2006-352530 A | 12/2006 |

OTHER PUBLICATIONS

Chinese Office Action for JP Application No. 201380005659.X issued on Feb. 4, 2015 with English Translation.

* cited by examiner

TRANSMISSION METHOD, TRANSMISSION DEVICE, TRANSMISSION PROGRAM, AND TRANSMISSION SYSTEM

This application is a National Stage Entry of PCT/JP2013/050402 filed on Jan. 11, 2013, which claims priority from Japanese Patent Application 2012-012164 filed on Jan. 24, 2012, the contents of all of which are incorporated herein by reference, in their entirety.

TECHNICAL FIELD

The present invention relates to a transmission method, a transmission device and a transmission program as well as a transmission system for extending a transmission distance which is a distance between bidirectional transmission devices.

BACKGROUND ART

There is a time compression multiplexing (TCM) system as a transmission system between transmission devices. The time compression multiplexing system is directed for realizing bidirectional transmission by performing time division on a pair of cables and repeating transmission and reception, and may be also called ping-pong transmission system. A technique for such a transmission system is described in Patent Literature 1.

With the bidirectional transmission device described in Patent Literature 1, when a transmission distance between a master machine and a slave machine is within a predetermined distance, a redundant period in a frame period is removed, thereby transmitting more data than in typical bidirectional transmission devices. Thereby, a performance of the entire transmission system can be enhanced.

CITATION LIST

Patent Literature

{PTL 1} JP-A-Hei 11-215107

SUMMARY OF INVENTION

Technical Problem

However, the technique described in Patent Literature 1 described above assumes that a distance between transmission devices is within a predetermined range.

That is, the technique described in Patent Literature 1 does not consider that a distance between transmission devices is longer beyond a predetermined range and a time required for transmission and reception is longer along with an increase in transmission distance.

Thus, the technique described in Patent Literature 1 can be effectively used only within a predetermined distance, and when the transmission devices are far away from each other and a transmission distance therebetween is longer, a redundant time cannot be removed. Further, when a transmission distance is longer, a transmission delay time increases similarly as in a typical technique, and thus data required for communication does not fall within a predetermined frame, which causes unable communication. As described above, various problems have been caused due to an increase in transmission distance.

In order to avoid the problems, a transmission distance has needed to be restricted or part of data required for communication has needed to be deleted.

It is therefore a purpose of the present invention to provide a transmission method, a transmission device and a transmission program as well as a transmission system capable of making communication even when transmission devices are far away from each other and a transmission distance therebetween is longer.

According to a first aspect of the present invention, there is provided a transmission device for alternately performing transmission and reception to/from a communication destination transmission device,
the transmission device comprising:
a transmission part that transmits transmit data to the communication destination transmission device;
a reception part that receives return data transmitted by the communication destination transmission device after the transmit data reaches the communication destination transmission device; and
a control part that, treats a predetermined period of time as one time unit, tries one transmission of transmit data and one reception of return data within the one time unit, and in the case of determining that the one transmission of transmit data and the one reception of return data do not fall within the one time unit, controls the transmission device such that N number of transmit data are continuously transmitted and then N number of return data are continuously received within N (N is an integer of two or more) time units.

According to a second aspect of the present invention, there is provided a transmission system in which one of a first transmission device and a second transmission device is on the master side and the other of them is on the slave side for making bidirectional transmission,
both the first transmission device and the second transmission device being the transmission devices according to any one of claims 1 to 5.

According to a third aspect of the present invention, there is provided a transmission method performed by a communication source transmission device for alternately performing transmission and reception to/from a communication destination transmission device,
the transmission method comprising:
transmitting transmit data to the communication destination transmission device;
receiving return data transmitted by the communication destination transmission device after the transmit data reaches the communication destination transmission device; and
treating a predetermined period of time as one time unit, trying one transmission of transmit data and one reception of return data within the one time unit, and in the case of determining that the one transmission of transmit data and the one reception of return data do not fall within the one time unit, controlling the communication source transmission device such that N number of transmit data are continuously transmitted and then N number of return data are continuously received within N (N is an integer of two or more) time units.

According to a fourth aspect of the present invention, there is provided a transmission program for causing a computer to function as a transmission device for alternately performing transmission and reception to/from a communication destination transmission device,
the transmission program for causing the computer to function as the transmission device comprising:
a transmission part that transmits transmit data to the communication destination transmission device;

a reception part that receives return data transmitted by the communication destination transmission device after the transmit data reaches the communication destination transmission device; and a control unit that, treats a predetermined period of time as one time unit, tries one transmission of transmit data and one reception of return data within the one time unit, and in the case of determining that the one transmission of transmit data and the one reception of return data do not fall within the one time unit, controls the transmission device such that N number of transmit data are continuously transmitted and then N number of return data are continuously received within N (N is an integer of two or more) time units.

Advantages Effects of the Invention

According to the present invention, it is possible to make communication even when transmission devices are far away from each other and a transmission distance therebetween is longer.

REFERENCE SIGNS LIST

100: Transmission part
110: Transmission frame control part
120: Transmission data control part
121: Transmission data holding part
130: Line driver part
131: AMI encoder
132: Driver
200: Frame generating part
300: Reception part
310: Reception data control part
311: Reception data holding part
320: Reception frame control part
330: Monitor part
340: Line receiver part
341: AMI decoder
342: Equalizer/receiver
1000, 2000: Transmission device

DESCRIPTION OF EMBODIMENTS

An embodiment according to the present invention will be described below in detail with reference to the drawings.

Figure 1:
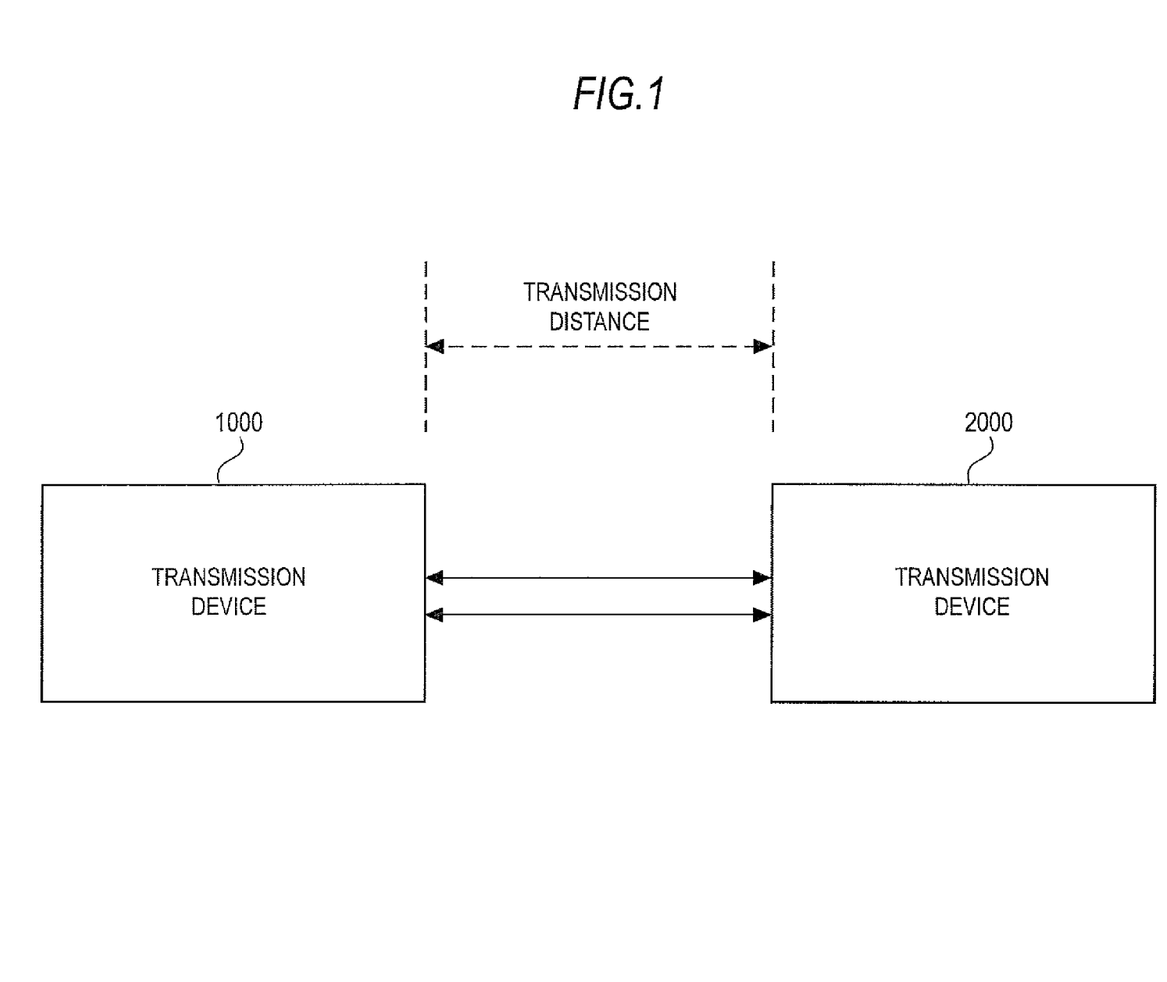
FIG. 1 A figure illustrates a basic structure of an entire transmission system according to an embodiment of the present invention.

With reference to FIG. 1, the present embodiment includes a transmission device 1000 and a transmission device 2000. The transmission device 1000 and the transmission device 2000 are connected to each other and make communication with each other. Then, the communication is assumed to conform to a two-wire bidirectional transmission system. Further, one of both is on the master side and the other is on the slave side during communication. Only two transmission devices are illustrated in FIG. 1, which is merely exemplary. According to the present embodiment, two or more transmission devices can make bidirectional communication. As a distance (which will be called "transmission distance" as needed) between the transmission device 1000 and the transmission device 2000 is longer, a transmission delay time, which is a time between when data is output from one transmission device and when the data reaches the other transmission device, is longer.

Furthermore, it is assumed herein that bidirectional communication is made between the transmission device 1000 on the master side and the transmission device 2000 on the slave side. In the following description, the transmission system including the transmission device 1000 and the transmission device 2000 will be called "present system." Moreover, data to be transmitted from the transmission device 1000 on the master side to the transmission device 2000 on the slave side will be called "transmit data" and data to be transmitted from the transmission device 2000 on the slave side to the transmission device 1000 on the master side will be called "return data."

Figure 2:
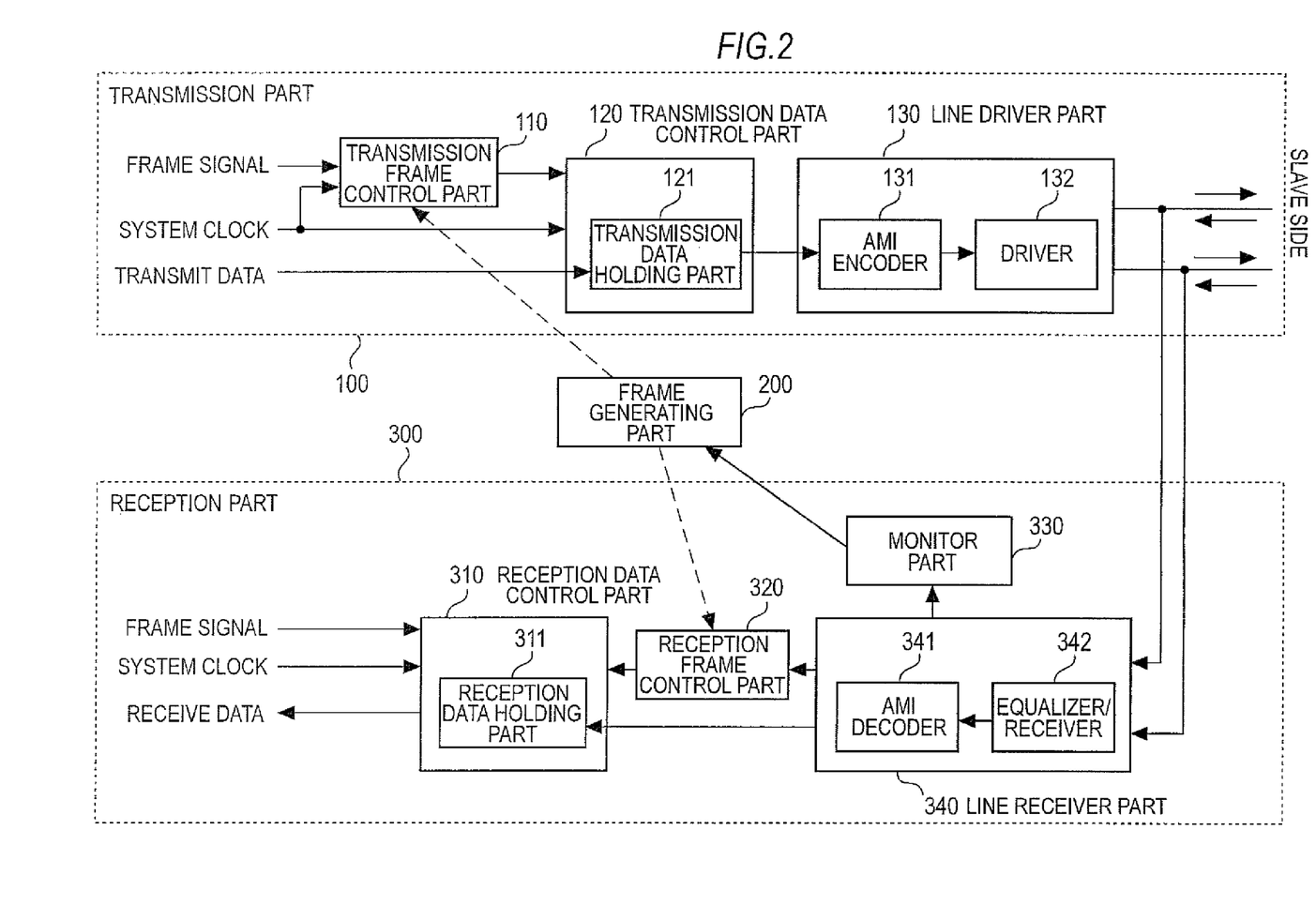
FIG. 2 A figure illustrates a basic structure of a transmission device according to the embodiment of the present invention.

A detailed structure of the transmission device will be described below with reference to FIG. 2. FIG. 2 illustrates the constituents included in the transmission device 1000, and the same constituents are assumed to be included in the transmission device 2000.

The transmission device 1000 is roughly divided into a transmission part (section or unit) 100, a frame generating part (section or unit) 200 and a reception part (section or unit) 300. The transmission part 100 includes a transmission frame control part 110, a transmission data control part 120 and a line driver part 130. The reception part 300 includes a reception data control part 310, a reception frame control part 320, a monitor part 330 and a line receiver part 340.

Figure 3:
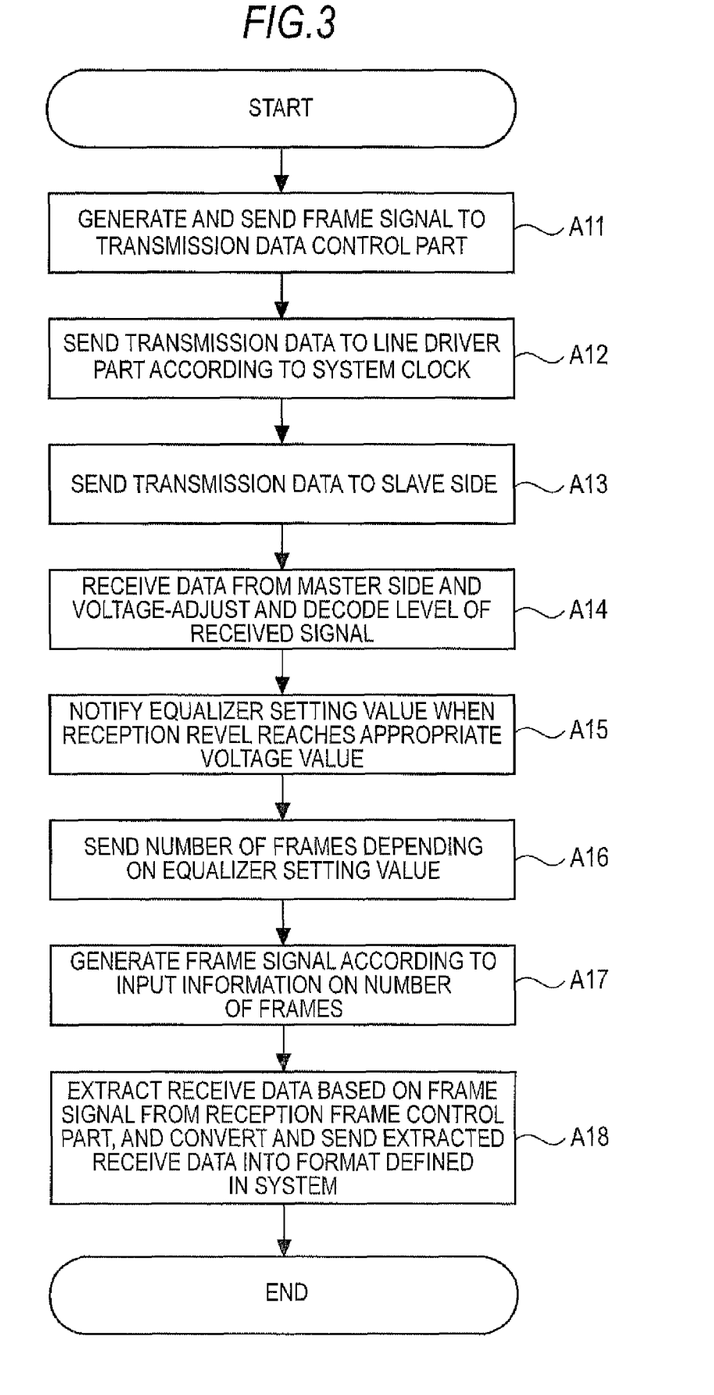
FIG. 3 A figure illustrates a flowchart of basic operations of the transmission device according to the embodiment of the present invention.

The functions of the respective parts will be described below in detail and the basic operations of the present embodiment will be described with reference to the flowchart of FIG. 3.

The transmission frame control part 110 receives input of frame signals and system clocks defined in the present system. Further, the transmission frame control part 110 receives information on the number of frames depending on an equalizer setting value from the frame generating part 200.

Then, the transmission frame control part 110 generates a frame signal based on the number of frames depending on the received frame signal, system clock and equalizer setting value, and sends the frame signal to the transmission data control part 120 (step A11).

The transmission data control part 120 receives input of the frame signal generated by the transmission frame control part 110 and input into the transmission data control part 120, the system clock and the transmit data.

The transmission data control part 120 generates a start bit based on the frame signal generated by the transmission frame control part 110. The transmission data control part 120 generates a start bit and holds the transmit data in a transmission data holding part 121 inside the transmission data control part 120.

Subsequently, the transmission data control part 120 serializes the generated start bit and transmit data according to a defined frame format. The serialized transmit data is sent to the line driver part 130 according to the system clock (step A12). Herein, serialization is to convert transmit data into a transmittable form.

The line driver part 130 includes an Alternate Mark Inversion code (AMI) encoder 131 and a driver 132. Then, the line driver part 130 encodes the serialized transmit data sent from the transmission data control part 120 by the AMI encoder 131. Then, the line driver part 130 sends the encoded transmit data to the slave side by the driver 132 (step A13).

Herein, the slave side is the transmission device 2000 as described above, and thus the encoded transmit data is sent to the transmission device 2000.

According to the present embodiment, the AMI encoder 131 and an AMI decoder 341 described later perform encoding and decoding conforming to the AMI encoding system. This is merely exemplary, and any encoding system other than the AMI encoding system may be accorded.

A monitor part 330 controls an equalizer/receiver 342 inside a line receiver part 340 (step A14). Herein, the line receiver part 340 includes the AMI decoder 341 and the equalizer/receiver 342. Then, the line receiver part 340 receives data from the transmission device 1000 on the master side by the equalizer/receiver 342, and voltage-adjusts a level of the reception signal under control of the reception level monitor/control part 330 by an equalizer as one function of the equalizer/receiver 342. The line receiver part 340 decodes the reception signal by the AMI decoder 341. Then, the line receiver part 340 sends the reception signal to the reception frame control part 320 and the reception data control part 310.

The monitor part 330 controls in step A14, and holds, as an appropriate equalizer setting value, an equalizer setting value when the reception level reaches an appropriate voltage value. Further, the monitor part 330 notifies the frame generating part 200 of the holding setting value (step A15). The specific contents of the control method in step A14 will be described below.

The frame generating part 200 determines the number of frames employed for one transmission and one reception depending on the equalizer setting value notified by the monitor part 330. Then, the frame generating part 200 sends the determined number of frames as information on the number of frames to the transmission frame control part 110 and the reception frame control part 320 (step A16).

Determining the number of frames will be described herein. According to the present embodiment, the amount of attenuation is first calculated based on a reception level. Herein, the amount of attenuation is a difference between a level of a transmission signal on the transmission side and a level of a reception signal on the reception side. Then, one transmission device 1000, 2000 previously knows a transmission level of the other transmission device 2000, 1000, respectively. Therefore, a reception level is measured thereby to calculate the amount of attenuation. A transmission distance is calculated based on the amount of attenuation of the reception signal level. Then, a transmission delay time is calculated based on the calculated transmission distance. How much the reception signal level attenuates by how far the distance is, and how much the transmission delay time is caused by how far the distance is are previously measured or calculated, and the above calculation can be made by use of the measurement or calculation result.

The frame generating part 200 determines the number of frames depending on the transmission delay time.

According to the present embodiment, a communication system called ping-pong transmission system is assumed to be used. In the ping-pong transmission system, transmission from the master and return from the slave are performed within a predetermined time (frame time). That is, transmission of transmit data from the master and reception of the transmit data on the slave, as well as transmission of return data from the slave and reception of the return data on the master are performed within one frame time.

However, when the transmission distance is longer, the transmission delay time is accordingly longer. Thus, in a certain transmission distance or more, transmission from the master and return from the salve are not performed within one frame time, and thus communication cannot be made.

Therefore, according to the present embodiment, when it is determined that transmission from the master and return from the slave do not fall within one frame time, the number of frames is determined at 2, for example, and transmission from the master is continuously performed twice and return from the slave is continuously performed twice within the two frames. Thereby, communication is enabled. When it is determined that the transmission from the master and the return from the slave do not fall within two frames, the number of frames is determined as further increasing to 3 frames, 4 frames, . . . . That is, when the transmission from the master and the return from the slave do not fall within one frame, N (N is an integer of 2 or more) frames in which data required for communication fall may be employed. Then, after transmit data is continuously transmitted N times within N-frame time, return data may be continuously received N times.

In this way, the frame generating part 200 determines whether one frame is employed, N frames are employed, or if N frames are employed, how many frames N are specifically employed. How many frames are employed is previously determined for how long the transmission delay time is.

The reception frame control part 320 generates a frame signal based on the start bit detected according to the information on the number of frames input from the frame generating part 200, and sends the frame signal to the reception data control part 310 (step A17).

The reception data control part 310 receives input of the frame signal and the system clock which are defined in the present system as well as the frame signal from the reception frame control part 320 and the receive data from the line receiver part 340.

Then, the reception data control part 310 extracts the receive data from the line receiver part 340 based on the frame signal from the reception frame control part 320, and holds the receive data in the reception data holding part 311.

Then, the reception data control part 310 converts and sends the holding receive data into a format defined in the present system according to the frame signal defined in the present system and the system clock defined in the present system (step S17).

The above described has been made by way of the operations of the respective parts in the transmission device 1000 on the master side, but the respective parts of the transmission device 2000 on the slave side operate in the same way.

Figure 4:
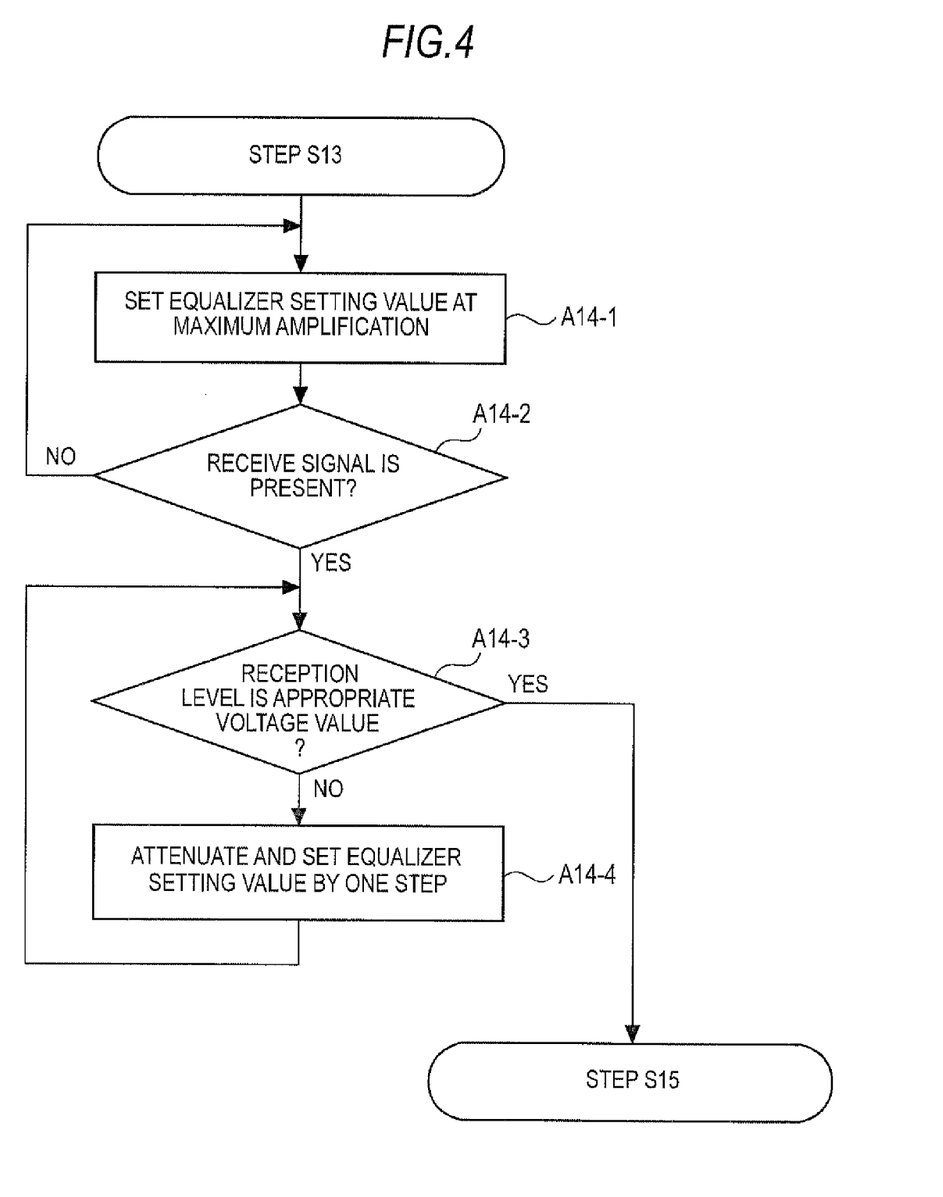
FIG. 4 A figure illustrates a flowchart of basic operations of a monitor part according to the embodiment of the present invention.

The operations of the line receiver part 340 according to the control operations of the monitor part 330 and its control will be described below according to the present embodiment with reference to the flowchart of FIG. 4. The operations correspond to step A14 in FIG. 3.

The reception level monitor/control part 330 maximally amplifies an input level of the line receiver part 340 by the equalizer/receiver 342 (step A14-1).

As a result of maximum amplification, when a reception signal cannot be recognized (NO in step A14-2), the operation is continued from step A14-1. On the other hand, when a reception signal is recognized (YES in step A14-2), a determination is made as to whether the voltage value of the reception signal is appropriate for a current amplification rate of the equalizer/receiver 342 (step A14-3). That is, a determination is made as to whether the voltage value of the output signal of the equalizer/receiver 342 is within a predetermined range.

When the voltage value of the reception signal is not an appropriate voltage value for a current amplification rate of the equalizer/receiver 342 (NO in step A14-3), the equalizer setting value is attenuated by one step (step A14-4). That is, the amplification rate of the equalizer is lowered by one step. Then, a detection is made again as to whether the voltage value of the reception signal is an appropriate voltage value for a current amplification rate of the equalizer/receiver 342 (step A14-3). When the voltage value is not appropriate yet (NO in step A14-3), the equalizer setting value is further attenuated by one step (step A14-4). The operation is repeated until the voltage value of the reception signal reaches an appropriate voltage value for a current amplification rate of the equalizer/receiver 342, and when an appropriate voltage value is reached (YES in step A14-3), the amplification rate of the equalizer/receiver 342 at this time is held as an appropriate equalizer setting value and information on the held setting value is notified to the frame generating part 200 (subsequent to step A15 in FIG. 3). The information on the held setting value may be an amplification rate itself or may be a numerical value (such as the number of attenuated steps) indicating the amplification rate.

Thereafter, the frame generating part 200 determines the number of frames employed for one transmission and one reception depending on the equalizer setting value notified from the monitor part 330 as described in step S16. Then, the frame generating part 200 sends the determined number of frames as information on the number of frames to the transmission frame control unit 110 and the reception frame control part 320. Specifically, when the number of frames is set at 2 in the frame generating part 200, the information on the number of frames of 2 is sent to the transmission frame control part 110 and the reception frame control part 320.

The transmission frame control part 110 generates a frame signal based on the information on the number of frames of 2 such that data for two frames defined in the present system is continuous, and sends the frame signal to the transmission data control part 120.

The reception frame control part 320 detects a start bit considering that the data for two frames is continuously transmitted based on the information on the number of frames of 2, and generates a frame signal. The reception frame control part 320 then sends the generated frame signal to the reception data control part 310.

The advantages of the present embodiment will be described below with reference to FIG. 5 to FIG. 7.

Figure 5:
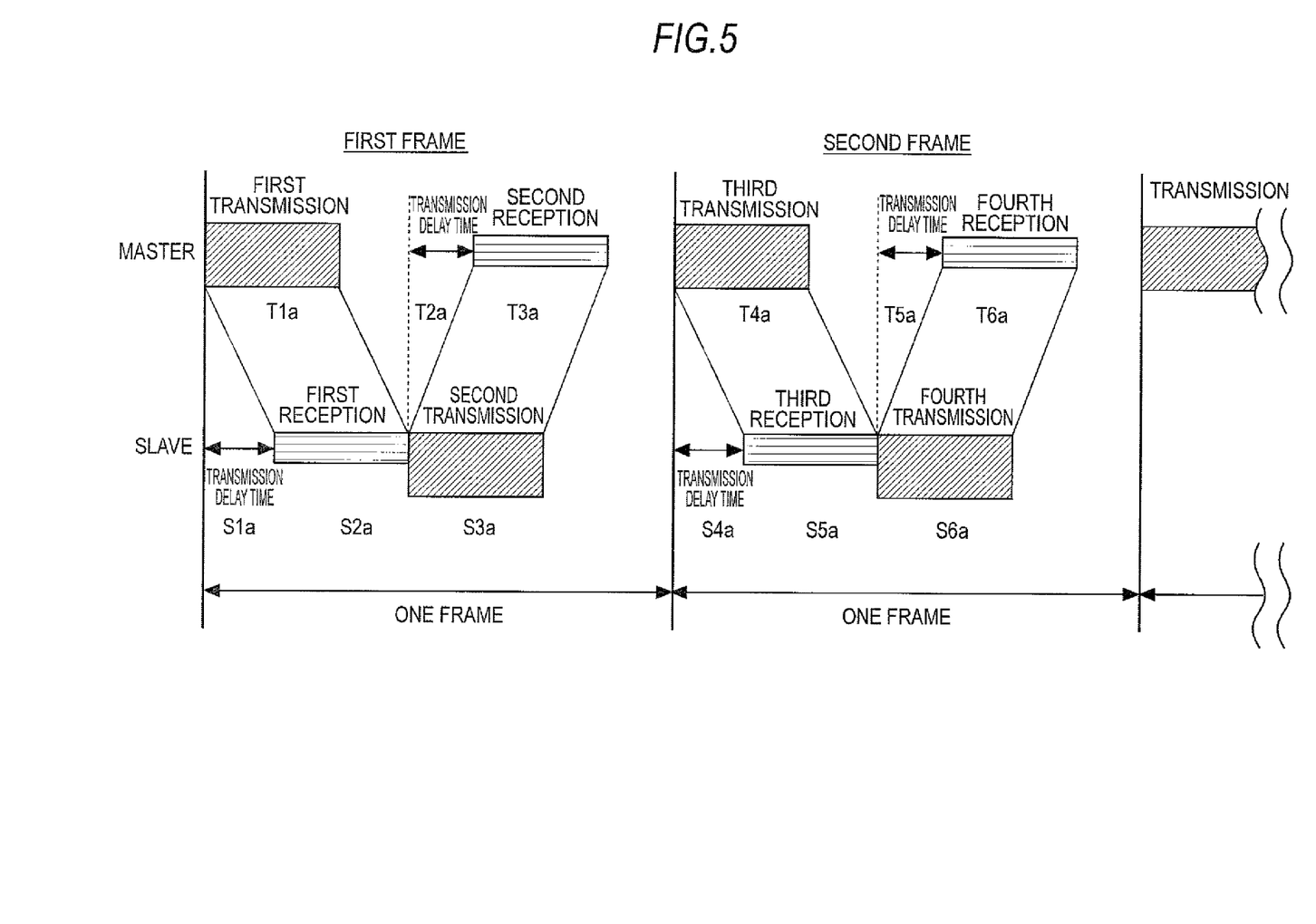
FIG. 5 A figure illustrates a diagram (1/3) for explaining an advantage of the embodiment of the present invention.

A time elapse in typically transmitting and receiving transmit data will be first illustrated in a 2-frame structure in FIG. 5.

A time required for sending master transmit data within one frame defined in the present system is assumed as T1$a$ in the first frame and T4$a$ in the second frame. A time (transmission delay time) between when the transmit data starts being sent from the master and when it starts being received on the slave is assumed as S1$a$ in the first frame and S4$a$ in the second frame. A time required for receiving the transmit data in the slave is assumed as S2$a$ in the first frame and S5$a$ in the second frame. Herein, T1$a$ is equal to S2$a$ and T4$a$ is equal to S5$a$. Similarly, for inversely transmitted and received data, a time required for sending return data by the slave is assumed as S3$a$ in the first frame and S6$a$ in the second frame. A time (transmission delay time) between when the return data starts being sent from the slave and when it starts being received by the master is assumed as T2$a$ in the first frame and T5$a$ in the second frame. A time required for receiving the return data by the master is assumed as T3$a$ in the first frame and T6$a$ in the second frame. Herein, S3$a$ is equal to T3$a$ and S6$a$ is equal to T6$a$.

At this time, the temporal lengths of the transmission delay times S1$a$, S4$a$, T2$a$ and T5$a$ are all equal. This is because the transmission distance of the transmit data is the same as the transmission distance of the return data.

With partially repeated description, the temporal lengths of the times T1$a$, S2$a$, S3$a$, T3$a$, T4$a$, S5$a$, S6$a$ and T6$a$ for transmitting and receiving the transmit data are all equal. This is because the amount of transmit data and the amount of return data per frame are all equal in any frame.

A case in which the transmission distance is longer than in FIG. 5 will be assumed below. When the transmission distance is extended, the transmission delay time increases, and thus a time elapse for transmitting and receiving data is extended from the transmission delay times S1$a$, T2$a$, S4$a$ and T5$a$ in FIG. 5 to the transmission delay times S1$b$, T2$b$, S4$b$ and T5$b$ as in FIG. 6, respectively.

Figure 6:
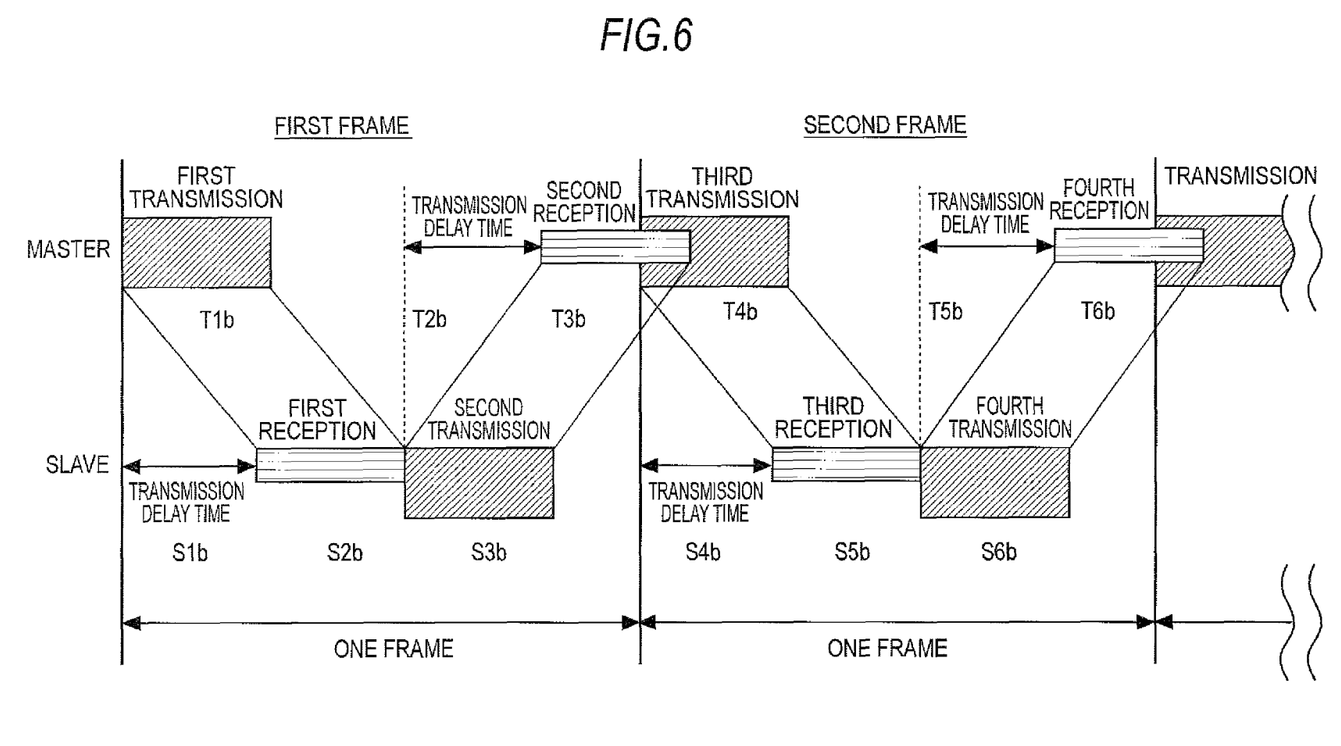
FIG. 6 A figure illustrates a diagram (2/3) for explaining an advantage of the embodiment of the present invention.

The state illustrated in FIG. 6 is a state in which data require for communication do not fall within one frame, and indicates that the data overlaps on transmit data in a next frame and thus communication is not possible. A typical technique cannot address such a case. Therefore, with a typical technique, the amount of data to be transmitted or received at one time is reduced thereby to shorten the times T1$a$, S2$a$, S3$a$, T3$a$, T4$a$, S5$a$, S6$a$ and T6$a$, or the transmission distance is shorten thereby to reduce the transmission delay times S1$b$, T2$b$, S4$b$ and T5$b$.

Figure 7:
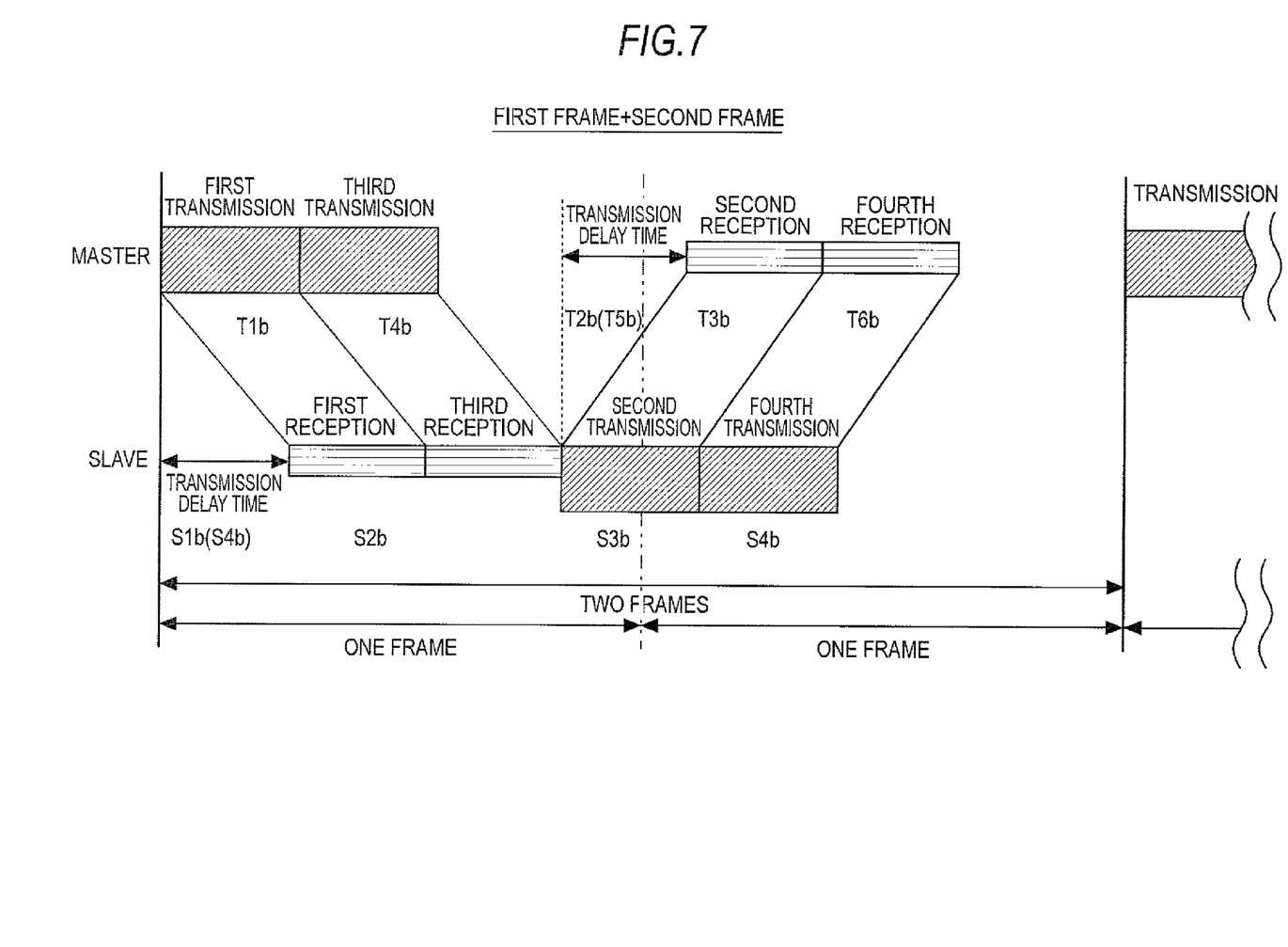
FIG. 7 A figure illustrates a diagram (3/3) for explaining an advantage of the embodiment of the present invention.

On the other hand, according to the present embodiment, the data in the first frame and the second frame is continuous as illustrated in FIG. 7, and the points where the transmission delay time occurs are reduced.

With reference to FIG. 7, the first transmission and the third transmission are continuously performed and thus a transmission delay time occurs only once for the transmit data. That is, the transmission delay time S1$b$ occurs but the transmission delay time S4$b$ is deleted. Similarly, the second transmission and the fourth transmission are continuously performed, and thus the transmission delay time T2$b$ occurs but the transmission delay time T5$b$ is deleted for the return data.

Consequently, even if the transmission delay time length and the amount of data to be transmitted or returned are the same, data require for communication is accepted. Thereby, the transmission distance can be extended according to the present embodiment.

The present description defines that when data required for communication do not fall within one frame, data for two frames is made continuous thereby to extend the distance. Alternatively, even when data required for communication do not fall within two or more frames, the same principle is employed to determine the number of consecutive frames as three frames, four frames and so one, thereby extending the distance.

For example, when data required for communication do not fall within two frames, data for three frames may be made continuous. When data required for communication do not fall within three frames, data for four frames may be made continuous. That is, when data required for communication do not fall in one frame, the number of consecutive frames may be N (N is an integer of 2 or more) frames in which data required for communication fall. Then, after transmit data is continuously transmitted N times, return data may be continuously received N times.

A variant of the above embodiment will be described. A transmission distance is determined by measuring a voltage value of a reception signal in the above description, but instead, a transmission delay time is calculated based on a difference between an expected reception time and an actual reception time, and N can be determined depending on the transmission delay time.

Specifically, when data cannot be transmitted and received within one frame is previously measured by how long a transmission delay time is.

Then, a time between the start of transmitting transmit data and the end of receiving return data is measured thereby to calculate a transmission delay time. Then, when it is determined that data do not fall within one frame in a current transmission delay time, it is determined that the data cannot be transmitted and received within one frame. Then, when it is determined that data cannot be transmitted and received within one frame, data for a plurality of frames is continuously transmitted and received thereby to extend the transmission distance.

A specific example of the method for determining the number of frames in the frame generating part 200 will be described herein.

According to the present embodiment, a value which changes depending on the amount of attenuation of a reception signal is first used. This time, a setting value of the equalizer/receiver 342 is assumed to be used as the value, which is assumed as a. A transmission delay time ΔT is calculated based on this α. Further, the number of frames n is determined based on the transmission delay time ΔT.

Herein, a relationship between α and a transmission delay time ΔT is previously measured or calculated to be in a table. In the present description, a setting value α of the equalizer/receiver 342 is associated with a transmission delay time ΔT to be a first table.

A method for determining the number of frames n based on a transmission delay time ΔT will be described below.

This time, the number of frames to be determined is n. Then, n number of transmit data are transmitted and n number of return data are received within n frames. Thereby, when a time required for transmitting or receiving one transmit data or one return data is assumed as TD, a time required for transmitting or receiving n number of transmit data or n number of return data within n frames is assumed as n·TD, respectively. Further, a length of a frame is assumed as TF. Additionally, when n number of transmit data are transmitted and n number of return data are received within n frames, a transmission delay time ΔT is caused on transmission and on reception, respectively. Thereby, 2·ΔT is cased within n frames.

From the above, when n number of transmit data are transmitted and n number of return data are received within n frames, n needs to meet the following condition a.

[Math. 1]

$$(n-1) \cdot T_F < 2n \cdot T_D + 2_\Delta T \leq n \cdot T_F \quad \text{Condition a}$$

Then, Equation (1) can be derived based on the condition a.

[Math. 2]

$$\frac{2_\Delta T}{T_F - 2T_D} < n \leq \frac{2_\Delta T + T_F}{T_F - 2T_D} \quad \text{Mathematical formula (1)}$$

The frame generating part 200 calculates a transmission delay time ΔT with reference to the first table and further makes calculations based on the calculated transmission delay time ΔT and Mathematical formula (1) thereby to determine n.

A relationship between a transmission delay time ΔT and n is previously calculated based on Mathematical formula (1) and the calculation result may be assumed as a table instead of calculating n based on Mathematical formula (1). That is, a second table in which a transmission delay time ΔT is associated with n may be created by previously making calculations based on Mathematical formula (1). By doing so, the frame generating part 200 can determine n by sequentially referring to the first table and the second table.

A third table may be created instead of employing the first table and the second table. That is, a table in which a is associated with n is created and this table is assumed as a third table. By doing so, the frame generating part 200 can determine n with reference to the third table.

A predetermined temporal margin may be employed for the number of frames as needed in consideration of an error in a relationship between the amount of signal attenuation and the transmission delay time or an accuracy of communication. The temporal margin is assumed as k and Mathematical formula (1) may be replaced with the following Mathematical formula (2).

[Math. 3]

$$\frac{2_\Delta T}{T_F - 2T_D} + k < n \leq \frac{2_\Delta T + T_F}{T_F - 2T_D} + k \quad \text{Mathematical formula (2)}$$

k is increased so that an accuracy of completing transmission and reception within n frames increases. On the other hand, when k is increased, an unwanted time may occur within the frames, and thus k needs to be an appropriate value in consideration of the points.

The above transmission device can be realized in hardware, software or a combination thereof. The transmission method performed by the above transmission device can be realized in hardware, software or a combination thereof. Herein, realization in software indicates that a computer reads a program for realization.

The program can be stored by use of various types of non-transitory computer readable mediums and can be supplied to the computer. The non-transitory computer readable mediums include various types of tangible storage mediums. Exemplary non-transitory computer readable mediums include magnetic recording mediums (such as flexible disk, magnetic tape and hard disk drive), magnetooptical recording mediums (such as magnetooptical disk), CD-ROM (Read Only Memory), CD-R, CD-R/W, and semiconductor memories (such as mask ROM, Programmable ROM (PROM), Erasable (EPROM PROM), flash ROM and random access memory (RAM)). The program may be supplied to the computer via various types of transitory computer readable mediums. Exemplary transitory computer readable mediums include an electric signal, an optical signal and an electromagnetic wave. The transitory computer readable mediums can supply the program to the computer via a wired communication path such as electric wire and optical fiber, or a wireless communication path.

The above embodiment is suitable for the present invention, and the scope of the present invention is not limited to only the above embodiment and various modifications may be made to the embodiment without departing from the spirit of the present invention.

The present application is based on Japanese Patent application No. 2012-012164 (filed on Jan. 24, 2012) and claims the priority of the Paris Convention based on Japanese Patent Application No. 2012-012164. The disclosure of Japanese Patent Application No. 2012-012164 is incorporated in the present specification with reference to Japanese Patent Application No. 2012-012164.

The representative embodiment according to the present invention has been described in detail, and various changes, substitutions and alternatives should be understood without departing from the spirit and scope of the present invention defined in Claims. Further, even if the claims are corrected in the application procedure, the inventors intend to maintain the equivalent scope of the claimed invention.

Part or all of the above embodiment can be described as in the following Supplementary notes, but is not limited to the following.

(Supplementary Note 1)

A transmission device for alternately performing transmission and reception to/from a communication destination transmission device, the transmission device comprising:
a transmission part that transmits transmit data to the communication destination transmission device;
a reception part that receives return data transmitted by the communication destination transmission device after the transmit data reaches the communication destination transmission device; and
a control part that, treats a predetermined period of time as one time unit, tries one transmission of transmit data and one reception of return data within the one time unit, and in the case of determining that the one transmission of transmit data and the one reception of return data do not fall within the one time unit, controls the transmission device such that N number of transmit data are continuously transmitted and then N number of return data are continuously received within N (N is an integer of two or more) time units.

(Supplementary Note 2)

The transmission device according to Supplementary note 1, further comprising:
a monitor part that monitors a voltage value of the received return data,
wherein whether the one transmission of transmit data and the one reception of return data falls within the one time unit, and when the one transmission of transmit data and the one reception of return data do not fall within the one time unit, what the value of N is are determined based on the voltage value monitored by the monitor part.

(Supplementary Note 3)

The transmission device according to Supplementary note 2, further comprising:
an equalizer that amplifies a voltage value of receive data received by the reception part at an adjustable amplification rate,
wherein processing of setting an amplification rate of the equalizer at a first setting value, confirming whether an output voltage value of the equalizer is appropriate, and when the output voltage value of the equalizer is not appropriate, setting the amplification rate at a second setting value lower by one step than the first setting value, and reconfirming whether an output voltage value of the equalizer is appropriate is repeated by newly applying the second setting value as the first setting value, and
whether the one transmission of transmit data and the one reception of return data falls within the one time unit, and when the one transmission of transmit data and the one reception of return data do not fall within the one time unit, what the number of N is are determined depending on a setting value of the amplification rate of the equalizer when the output voltage value of the equalizer reaches an appropriate value.

(Supplementary Note 4)

The transmission device according to Supplementary note 1, further comprising: a monitor part that measuring a time from a start of the one transmission of transmit data to an end of the one reception of return data;
wherein a transmission delay time for transmitting and receiving transmit data and return data is calculated based on the time measured by the monitor part, and whether the one transmission of transmit data and the one reception of return data falls within the one time unit, and when the one transmission of transmit data and the one reception of return data do not fall within the one time unit, what the number of N is are determined based on the transmission delay time.

(Supplementary Note 5)

The transmission device according to any one of Supplementary notes 1 to 4, wherein the amount of transmit data for the one transmission and the amount of return data for the one reception are constant.

(Supplementary Note 6)

A transmission system in which one of a first transmission device and a second transmission device is on the master side and the other of them is on the slave side for making bidirectional transmission,
both the first transmission device and the second transmission device being the transmission devices according to any one of Supplementary notes 1 to 5.

(Supplementary Note)

A transmission method performed by a communication source transmission device for alternately performing transmission and reception to/from a communication destination transmission device,
the transmission method comprising:
transmitting transmit data to the communication destination transmission device;
receiving return data transmitted by the communication destination transmission device after the transmit data reaches the communication destination transmission device; and
treating a predetermined period of time as one time unit, trying one transmission of transmit data and one reception of return data within the one time unit, and in the case of determining that the one transmission of transmit data and the one reception of return data do not fall within the one time unit, controlling the communication source transmission device such that N number of transmit data are continuously transmitted and then N number of return data are continuously received within N (N is an integer of two or more) time units.

(Supplementary Note 8)

The transmission method according to Supplementary note 7, including the steps of:
monitoring a voltage value of the received return data; and
determining whether one transmission of transmit data and one reception of return data fall within one time unit, and when one transmission of transmit data and one reception of return data do not fall within one time unit, what the N value is based on the monitored voltage value.

(Supplementary Note 9)

The transmission method according to Supplementary note 8, wherein the communication source transmission device includes an equalizer that amplifies a voltage value of the received return data at an adjustable amplification rate, and processing of setting an amplification of the equalizer at a first setting value, confirming whether an output voltage value of the equalizer is appropriate, when the output voltage value of the equalizer is not appropriate, setting the amplification rate at a second setting value lower by one step than the first setting value, and reconfirming whether an output voltage value of the equalizer is appropriate is repeated by newly applying the second setting value as the first setting value, and whether one transmission of transmit data and one reception of return data fall within one time unit, and when one transmission of transmit data and one reception of return data do not fall within one time unit, what the number of N is are determined depending on a setting value of the amplification rate of the equalizer when the output voltage value of the equalizer reaches an appropriate value.

(Supplementary Note 10)

The transmission method according to Supplementary note 7, including the steps of:

measuring a time between when the start of one transmission of transmit data and the end of one reception of return data; and calculating a transmission delay time for transmitting and receiving transmit data and return data based on the measured time, and determining whether one transmission of transmit data and one reception of return data fall within one time unit, and when one transmission of transmit data and one reception of return data do not fall within one time unit, what the number N is based on the transmission delay time.

(Supplementary Note 11)

The transmission method according to any one of Supplementary notes 7 to 10, wherein the amount of transmit data for one transmission and the amount of return data for the one reception are constant.

(Supplementary Note 12)

A transmission program for causing a computer to function as a transmission device for alternately performing transmission and reception to/from a communication destination transmission device, the transmission program for causing the computer to function as the transmission device comprising:

a transmission part that transmits transmit data to the communication destination transmission device;

a reception part that receives return data transmitted by the communication destination transmission device after the transmit data reaches the communication destination transmission device; and a control part that, treats a predetermined period of time as one time unit, tries one transmission of transmit data and one reception of return data within the one time unit, and in the case of determining that the one transmission of transmit data and the one reception of return data do not fall within the one time unit, controls the transmission device such that N number of transmit data are continuously transmitted and then N number of return data are continuously received within N (N is an integer of two or more) time units.

(Supplementary Note 13)

The transmission program according to Supplementary note 12, the transmission program for causing the computer to further function as a transmission device, the transmission device which further includes a monitor part that monitors a voltage value of the received return data, and determines whether one transmission of transmit data and one reception of return data fall within one time unit, and when one transmission of transmit data and one reception of return data do not fall within one time unit, what the N value is based on a voltage value monitored by the monitor part.

(Supplementary Note 14)

The transmission program according to Supplementary note 13, the transmission program for causing the computer to further function as a transmission device, the transmission device which further includes an equalizer that amplifies a voltage value of receive data received by the reception part at an adjustable amplification rate, and repeats processing of setting an amplification rate of the equalizer at a first setting value, confirming whether an output value of the equalizer is appropriate, when the output value of the equalizer is not appropriate, setting the amplification rate at a second setting value lower by one step than the first setting value, and reconfirming whether an output voltage value of the equalizer is appropriate by newly applying the second setting value as the first setting value, and determines whether one transmission of transmit data and one reception of return data fall within one time unit, and when one transmission of transmit data and one reception of return data do not fall within one time unit, what the number N is depending on a setting value of the amplification rate of the equalizer when an output voltage value of the equalizer reaches an appropriate value.

(Supplementary Note 15)

The transmission program according to Supplementary note 12, the transmission program for causing the computer to further function as a transmission device, the transmission device which further includes a monitor part that measuring a time between the start of one transmission of transmit data and the end of one reception of return data, and calculates a transmission delay time for transmitting and receiving transmit data and return data based on a time measured by the monitor part, and determines whether one transmission of transmit data and one reception of return data fall within one time unit, or when one transmission of transmit data and one reception of return data do not fall within one time unit, what the N value is based on the transmission delay time (Supplementary Note 16)

The transmission program according to any one of Supplementary notes 12 to 15, the transmission program for causing the computer to further function as a transmission device in which the amount of transmit data for one transmission and the amount of return data for one reception are constant.

INDUSTRIAL APPLICABILITY

The present invention is applicable to any transmission device for performing transmission and reception within a predetermined time.

What is claimed is:

1. A transmission device for alternately performing transmission and reception to/from a communication destination transmission device, the transmission device comprising:

a transmission part that transmits transmit data to the communication destination transmission device;

a reception part that receives return data transmitted by the communication destination transmission device after the transmit data reaches the communication destination transmission device;

a monitor that monitors a voltage value of the received return data;

an equalizer that amplifies the voltage value of the received return data at an adjustable amplification rate; and a control part that treats a predetermined period of time as one time unit, tries one transmission of transmit data and one reception of return data within the one time unit, and in the case of determining that the one transmission of transmit data and the one reception of return data do not fall within the one time unit, controls the transmission device such that N number of transmit data are continuously transmitted and then N number of return data are continuously received within N (N is an integer of two or more) time units, the transmission device adjusting a setting value of an amplification rate of the equalizer while confirming whether an output voltage value of the equalizer is appropriate, and determining whether the one transmission of transmit data and the one reception of return data falls within the one time unit, and when the one transmission of transmit data and the one reception of return data do not fall within the one time unit, what the number of N is, depending on a setting value of the amplification rate of the equalizer when the output voltage value of the equalizer reaches an appropriate value.

2. The transmission device according to claim 1, wherein: processing of setting the amplification rate of the equalizer at a first setting value, confirming whether an output voltage value of the equalizer is appropriate, and when the output voltage value of the equalizer is not appropriate, setting the amplification rate at a second setting value lower by one step than the first setting value, and reconfirming whether an output voltage value of the equalizer is appropriate is repeated by newly applying the second setting value as the first setting value, and whether the output voltage value of the equalizer is appropriate or not is confirmed by repeating the processing.

3. The transmission device according to claim 1, wherein the amount of transmit data for the one transmission and the amount of return data for the one reception are constant.

4. A transmission system in which one of a first transmission device and a second transmission device is on the master side and the other of them is on the slave side for making bidirectional transmission, and both the first transmission device and the second transmission device are the transmission devices according to claim 1.

5. A transmission method for alternately performing transmission and reception to/from a communication destination transmission device, the transmission method comprising:

a transmission step of transmitting transmit data to the communication destination transmission device;

a reception step of receiving return data transmitted by the communication destination transmission device after the transmit data reaches the communication destination transmission device;

a monitor step of monitoring a voltage value of the received return data;

a step of adjusting an equalizer that amplifies the voltage value of the received return data at an adjustable amplification rate; and a control step of treating a predetermined period of time as one time unit, trying one transmission of transmit data and one reception of return data within the one time unit, and in the case of determining that the one transmission of transmit data and the one reception of return data do not fall within the one time unit, controlling the communication source transmission device such that N number of transmit data are continuously transmitted and then N number of return data are continuously received within N (N is an integer of two or more) time units, the transmission method adjusting a setting value of an amplification rate of the equalizer while confirming whether an output voltage value of the equalizer is appropriate, and determining whether the one transmission of transmit data and the one reception of return data falls within the one time unit, and when the one transmission of transmit data and the one reception of return data do not fall within the one time unit, what the number of N is, depending on a setting value of the amplification rate of the equalizer when the output voltage value of the equalizer reaches an appropriate value.

6. The transmission method according to claim 5, wherein: processing of setting the amplification rate of the equalizer at a first setting value, confirming whether an output voltage value of the equalizer is appropriate, and when the output voltage value of the equalizer is not appropriate, setting the amplification rate at a second setting value lower by one step than the first setting value, and reconfirming whether an output voltage value of the equalizer is appropriate is repeated by newly applying the second setting value as the first setting value, and confirming whether the output voltage value of the equalizer is appropriate or not by repeating the processing.

7. A non-transitory computer readable information storage medium on which a program is recorded, said program, when executed, causing a computer to function as a transmission device for alternately performing transmission and reception to/from a communication destination transmission device, the program when executed by the computer performs a method comprising:

transmitting transmit data to the communication destination transmission device;

receiving return data transmitted by the communication destination transmission device after the transmit data reaches the communication destination transmission device;

monitoring a voltage value of the received return data;

adjusting an equalizer that amplifies the voltage value of the received return data at an adjustable amplification rate;

treating a predetermined period of time as one time unit, trying one transmission of transmit data and one reception of return data within the one time unit, and in the case of determining that the one transmission of transmit data and the one reception of return data do not fall within the one time unit, controlling the transmission device such that N number of transmit data are continuously transmitted and then N number of return data are continuously received within N (N is an integer of two or more) time units; and adjusting a setting value of an amplification rate of the equalizer while confirming whether an output voltage value of the equalizer is appropriate, and determining whether the one transmission of transmit data and the one reception of return data falls within the one time unit, and when the one transmission of transmit data and the one reception of return data do not fall within the one time unit, what the number of N is, depending on a setting value of the amplification rate of the equalizer when the output voltage value of the equalizer reaches an appropriate value.

8. The non-transitory computer readable information storage medium according to claim 7, the program, when executed wherein processing of setting the amplification rate of the equalizer at a first setting value, confirming whether an output voltage value of the equalizer is appropriate, and when the output voltage value of the equalizer is not appropriate, setting the amplification rate at a second setting value lower by one step than the first setting value, and reconfirming whether an output voltage value of the equalizer is appropriate is repeated by newly applying the second setting value as the first setting value, and confirming whether the output voltage value of the equalizer is appropriate or not by repeating the processing.

* * * * *